(12) United States Patent
Chen et al.

(10) Patent No.: US 7,755,925 B2
(45) Date of Patent: Jul. 13, 2010

(54) STATIC RANDOM ACCESS MEMORY

(75) Inventors: Jui-Lung Chen, Hsinchu (TW);
Gia-Hua Hsieh, Taipei (TW); Yi-Hsun Chung, Miaoli (TW); Chia-Chiuan Chang, Miaoli (TW); Yu-Chih Yeh, Tainan (TW); Ho-Hsiang Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 833 days.

(21) Appl. No.: 11/636,524

(22) Filed: Dec. 11, 2006

(65) Prior Publication Data

US 2008/0137398 A1    Jun. 12, 2008

(51) Int. Cl.
*G11C 11/00* (2006.01)

(52) U.S. Cl. .................. 365/154; 365/156; 365/229

(58) Field of Classification Search .............. 365/154, 365/156, 229
See application file for complete search history.

(56) References Cited

U.S. PATENT DOCUMENTS

| 6,549,453 B2 | 4/2003 | Wong |
| 6,560,139 B2 | 5/2003 | Ma et al. |
| 6,603,345 B2 | 8/2003 | Takahashi |
| 2004/0125681 A1* | 7/2004 | Yamaoka et al. ............ 365/229 |

* cited by examiner

*Primary Examiner*—Huan Hoang
(74) *Attorney, Agent, or Firm*—Birch, Stewart, Kolasch & Birch, LLP

(57) ABSTRACT

A static random access memory comprising a column driver, a row driver, a cell, and a control unit is disclosed. The column driver selects a first word line or a second word line. The row provides data to a first bit line and a second bit line. The data of the first bit line is opposite to that of the second bit line. The control unit controls the voltage of the cell. In normal mode, the voltage of the cell is equal to a second voltage. In stand-by mode, the voltage of the cell exceeds the second voltage.

7 Claims, 7 Drawing Sheets

STATIC RANDOM ACCESS MEMORY

BACKGROUND OF THE INVENTION

1. Field of the Invention

The invention relates to a memory, and more particularly to a static random access memory.

2. Description of the Related Art

Typical memory devices include read only memory (ROM) and random access memory (RAM). When power is interrupted, ROM data remains and RAM data is eliminated. RAM comprises dynamic random access memory (DRAM) and static random access memory (SRAM).

Each DRAM comprises a plurality of memory cells, each comprising a capacitor such that a refresh circuit is required to cyclically charge the capacitor to maintain the voltage of the capacitor. Each SRAM is formed by a plurality of transistors such that the SRAM is faster. The SRAM does not require a refresh circuit.

In deep submicron technology, SRAM is a commonly used storage unit suitable for high speed, low power, communication or system on chip (SOC) products.

FIG. 1 is a schematic diagram of a conventional static random access memory. A static random access memory 10 comprises six transistors. Since a larger leakage current is generated in static random access memory 10, the operating voltage VDD is reduced by a conventional solution. When the operating voltage VDD is reduced, a read margin of static random access memory 10 is also reduced.

BRIEF SUMMARY OF THE INVENTION

Static random access memory is provided. An exemplary embodiment of a static random access memory comprises a column driver, a row driver, a first P-type transistor, a second P-type transistor, a first N-type transistor, a second N-type transistor, a third N-type transistor, a fourth N-type transistor, and a control unit. The column driver selects a first word line or a second word line according to an address signal. The row driver provides data to a first bit line and a second bit line. The data received by the first bit line is opposite to that of the second bit line. The first P-type transistor comprises a first electrode receiving a first voltage. The second P-type transistor comprises a first electrode receiving the first voltage. The first N-type transistor comprises a gate coupled to a gate of the first P-type transistor and a second electrode of the second P-type transistor, a first electrode coupled to a second electrode of the first P-type transistor, a second electrode coupled to a point, and a substrate receiving a second voltage. The second N-type transistor comprises a gate coupled to a gate of the second P-type transistor and the second electrode of the first P-type transistor, a first electrode coupled to the second electrode of the second P-type transistor, a second electrode coupled to the point, and a substrate receiving the second voltage. The third N-type transistor comprises a gate coupled to the first word line, a first electrode coupled to the first bit line, a second electrode coupled to the second electrode of the first P-type transistor, and a substrate receiving the second voltage. The fourth N-type transistor comprises a gate coupled to the first word line, a first electrode coupled to the second bit line, a second electrode coupled to the second electrode of the second P-type transistor, and a substrate receiving the second voltage. The control unit controls a voltage of the point. In a normal mode, the voltage of the point is equal to the second voltage. In a stand-by mode, the voltage of the point exceeds the second voltage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
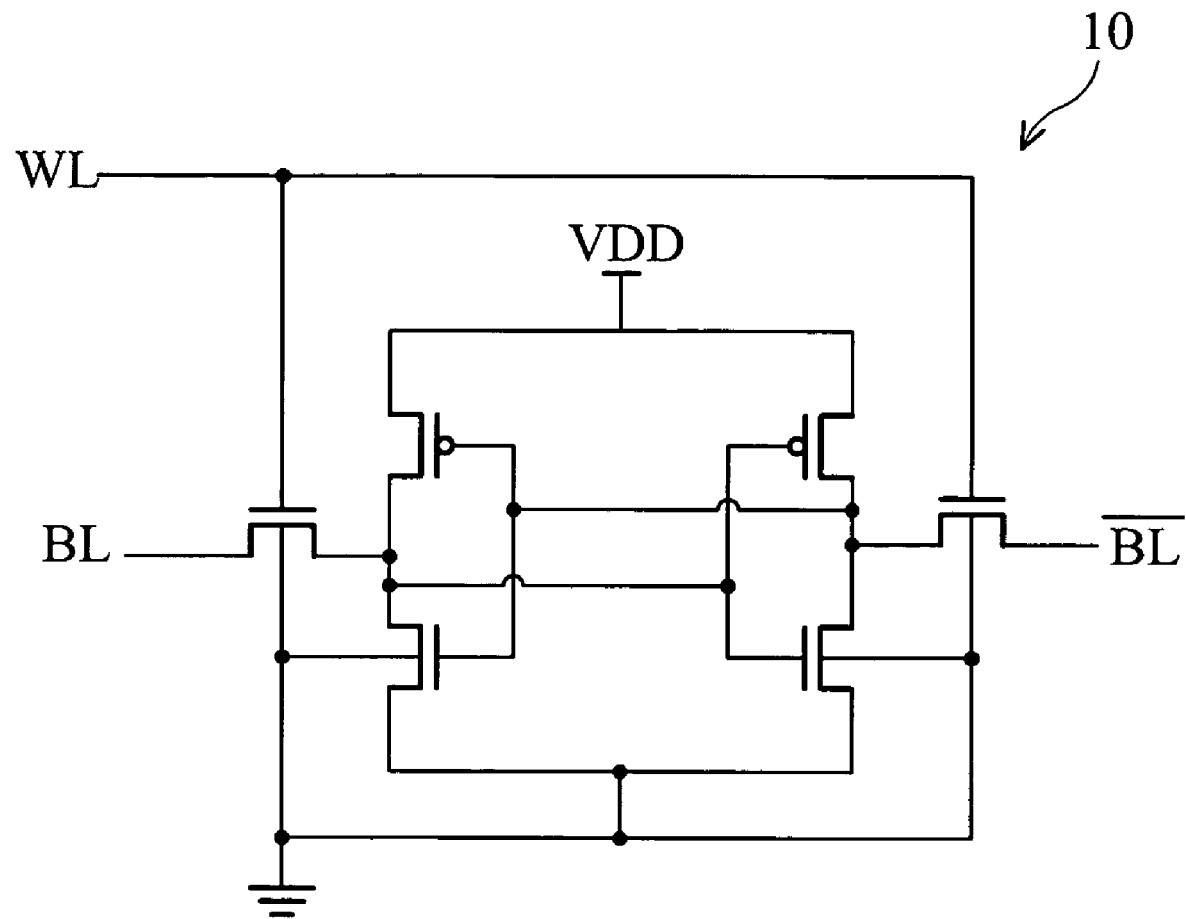
FIG. 1 is a schematic diagram of a conventional static random access memory.
Figure 2:
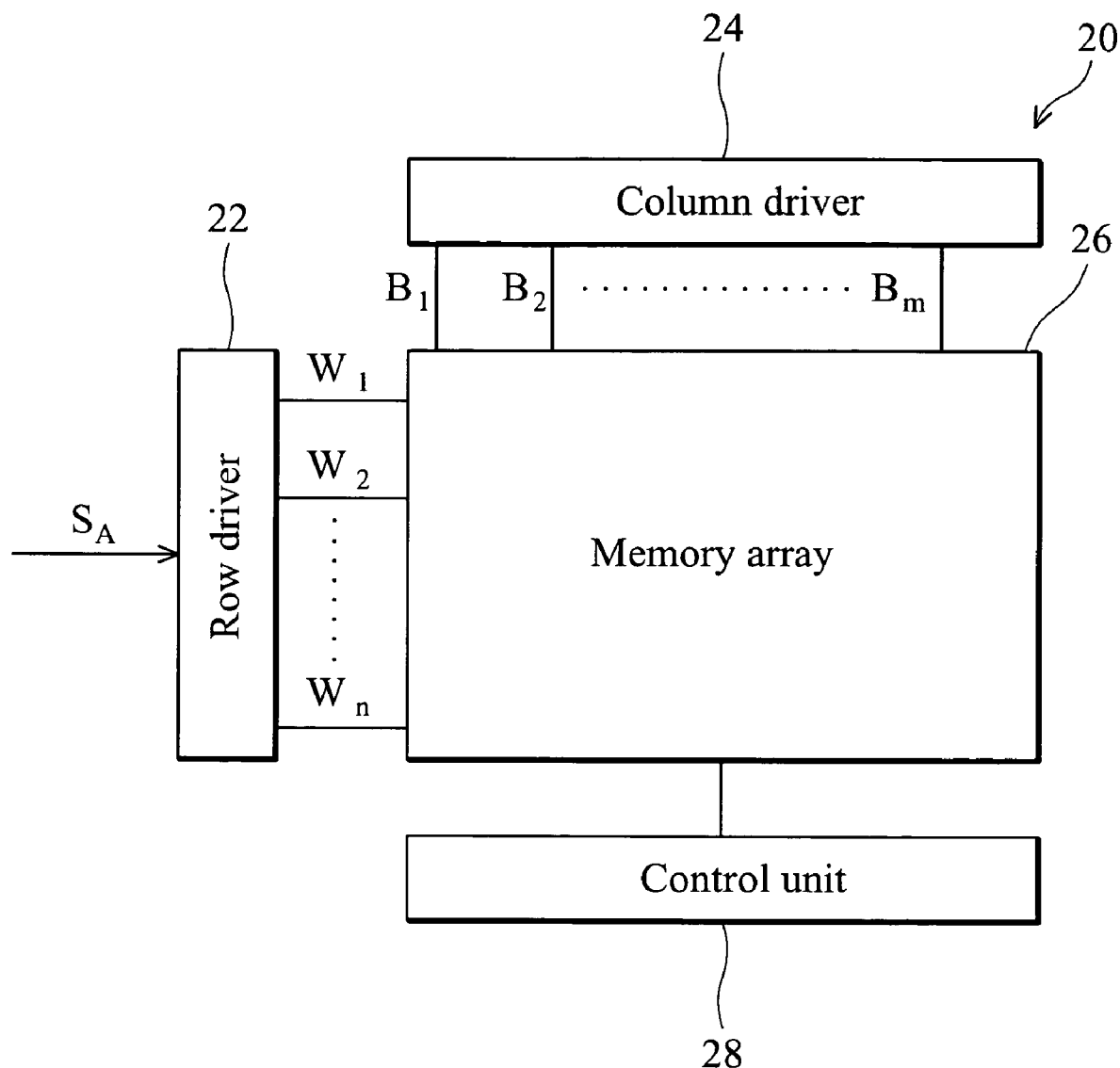
FIG. 2 is a schematic diagram of an exemplary embodiment of a static random access memory.

FIG. 2 is a schematic diagram of an exemplary embodiment of a static random access memory. Static random access memory 20 comprises a row driver 22, a column driver 24, a memory array 26, and a control unit 28.

Row driver 22 selects one of word lines $W_1 \sim W_N$ according to an address signal $S_A$ and transmits an enable signal to memory array 26 through the selected word line. Column driver 24 writes data into memory cells of memory array 26 through bit lines $B_1 \sim B_m$. Memory array 26 comprises a plurality of memory cells. Each memory cell is coupled to the corresponding word line and the corresponding bit lines.

Control unit 28 controls voltages of memory cells for reducing leakage current of memory cells. In a stand-by mode, the voltage of memory cells is equal to a first preset voltage. In a normal mode, the voltage of memory cells is equal to a second preset voltage less than the first preset value.

Figure 3:
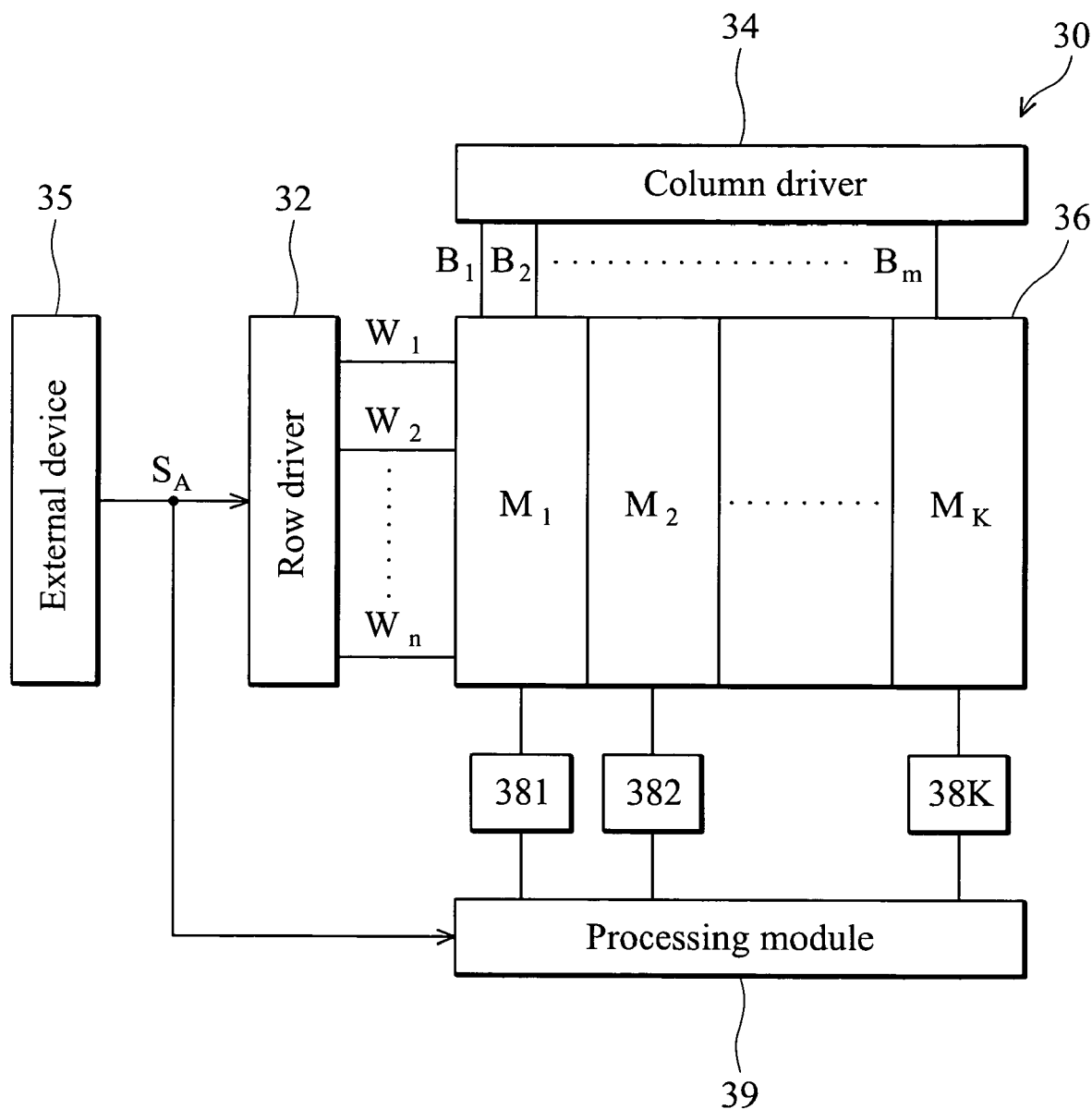
FIG. 3 is a schematic diagram of another exemplary embodiment of a static random access memory.

FIG. 3 is a schematic diagram of another exemplary embodiment of a static random access memory. Static random access memory 30 comprises a row driver 32, a column driver 34, a memory array 36, control units 381~38K, and a processing module 39.

Since the operations of row drivers 22 and 32 are the same and the operations of column drivers 24 and 34 are the same, descriptions of row driver 32 and column driver 34 are omitted. Memory array 36 comprises memory modules $M_1 \sim M_K$. Control units 311~31K respectively control the voltages of memory modules $M_1 \sim M_K$. Processing module 39 selectively activates one of control units 311~31K for controlling the voltage of one memory module according to the address signal $S_A$.

In a stand-by mode, the address signal $S_A$ does not output by an external device 35 such that control units 311~31K are deactivated by processing module 39. Thus, the voltages of memory modules $M_1 \sim M_K$ are equal to the first value. In a normal mode, the address signal $S_A$ is output by an external device 35 such that processing module 39 activates one control unit 311~31K according to the address signal $S_A$. Thus, the voltage of the activated memory module is reduced to the second preset value.

For example, when the address signal $S_A$ corresponds to address of memory module $M_1$, control unit 381 is activated by processing module 39. Thus, the voltage of memory module $M_1$ is equal to the second preset value. Next, row driver 32 transmits an enable signal to memory module $M_1$ through one of word lines $W_1$~$W_n$ such that one memory cell of memory module $M_1$ receives data on bit lines $B_1$ and $B_2$.

Figure 4A:
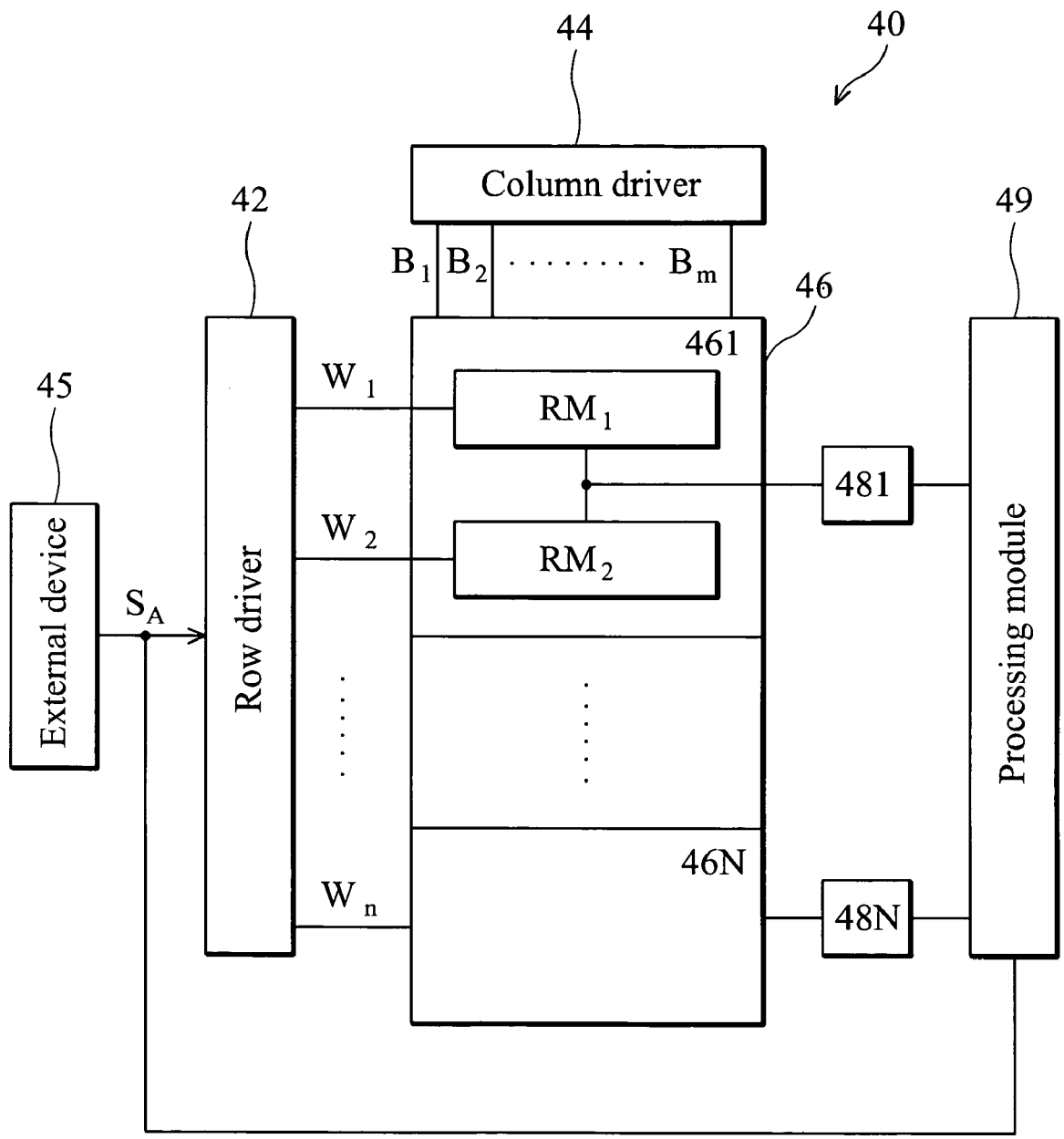
FIG. 4a is a schematic diagram of another exemplary embodiment of a static random access memory.

FIG. 4a is a schematic diagram of another exemplary embodiment of a static random access memory. Static random access memory 40 comprises a row driver 42, a column driver 44, a memory array 46, control units 481~48N, and a processing module 49.

Since the operations of row drivers 22 and 42 are the same and the operations of column drivers 24 and 44 are the same, descriptions of row driver 42 and column driver 44 are omitted. Memory array 46 comprises memory modules 461~46N. Each memory module comprises row memory cells $RM_1$ and $RM_2$. Control units 481~48N respectively control the voltages of memory modules 461~46N. Processing module 49 selectively activates one of control units 481~48N for controlling the voltage of one memory module according to the address signal $S_A$.

For example, when the address signal $S_A$ corresponds to the address of row memory cell $RM_1$ or $RM_2$ of memory module 461, control unit 481 is activated by processing module 49. Thus, the voltages of row memory cells $RM_1$ and $RM_2$ are equal to the second preset value. Next, row driver 42 selects word line $W_1$ or $W_2$ according to the address signal $S_A$ such that row memory cell $RM_1$ or $RM_2$ receives data on bit lines $B_1$ and $B_2$.

Figure 4B:
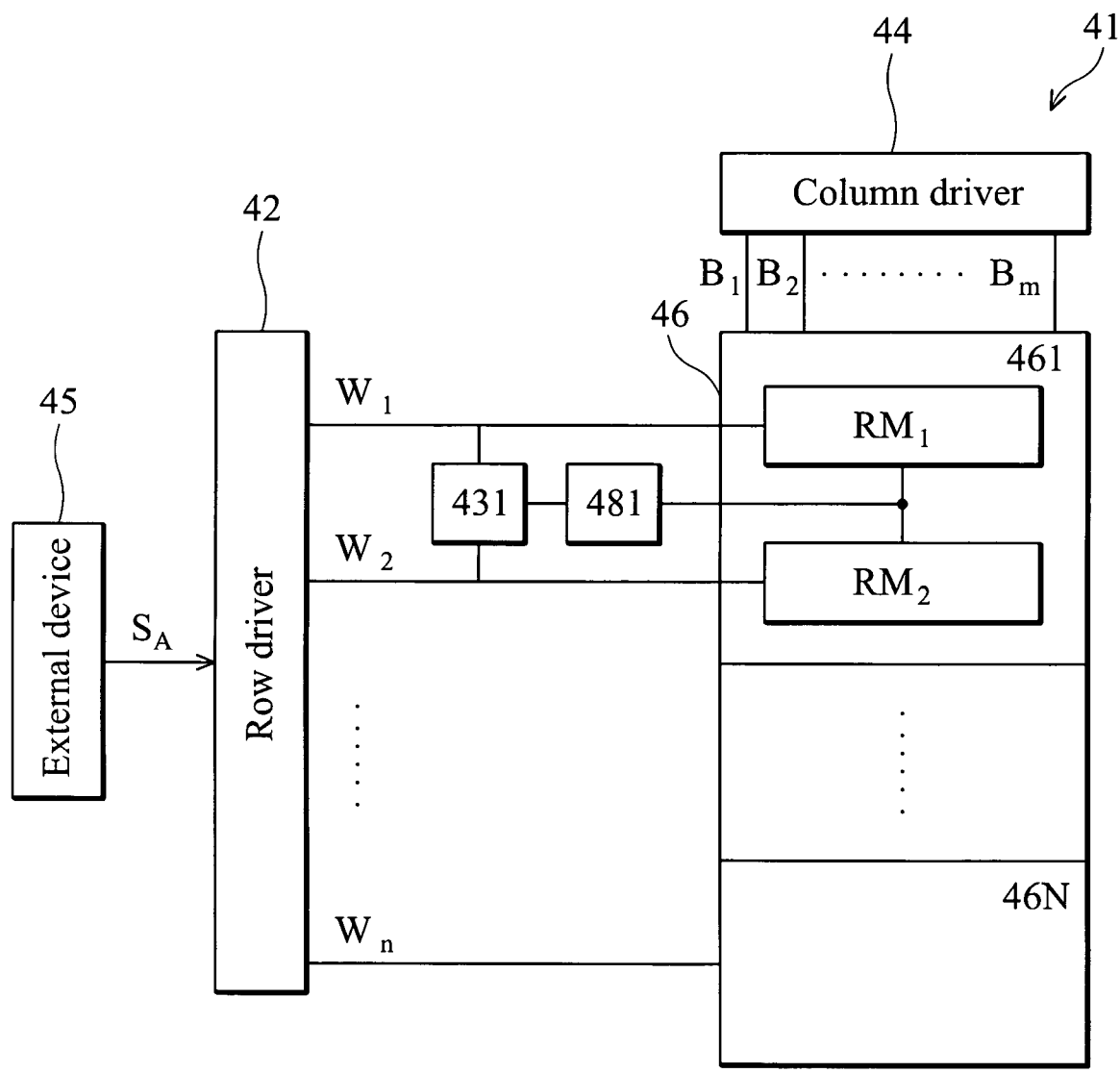
FIG. 4b is a schematic diagram of another exemplary embodiment of a static random access memory.

FIG. 4b is a schematic diagram of another exemplary embodiment of a static random access memory. FIG. 4b is similar to FIG. 4a except that a processor 431 of FIG. 4b activates control unit 481 to control voltage of row memory cell $M_1$ or $M_2$ according to the voltages of word lines $W_1$ and $W_2$.

In a stand-by mode, word line $W_1$ or $W_2$ does not selected by row driver 42 such that control unit 481 is deactivated by processor 43. Thus, the voltage of row memory cell $RM_1$ or $RM_2$ is equal to the first preset value.

In a normal mode, when the address signal $S_A$ corresponds to the address of row memory cell $RM_1$ or $RM_2$, word line $W_1$ or $W_2$ is selected by row driver 42. Thus, row memory cell $RM_1$ or $RM_2$ is ready to receive data on bit lines $B_1$ and $B_2$. When word line $W_1$ or $W_2$ is selected, control unit 481 is activated by processor 431. Thus, the voltage of row memory cell $RM_1$ or $RM_2$ is reduced from the first preset value to the second preset value and then data on bit lines $B_1$ and $B_2$ is received by row memory cell $RM_1$ or $RM_2$.

Figure 5:
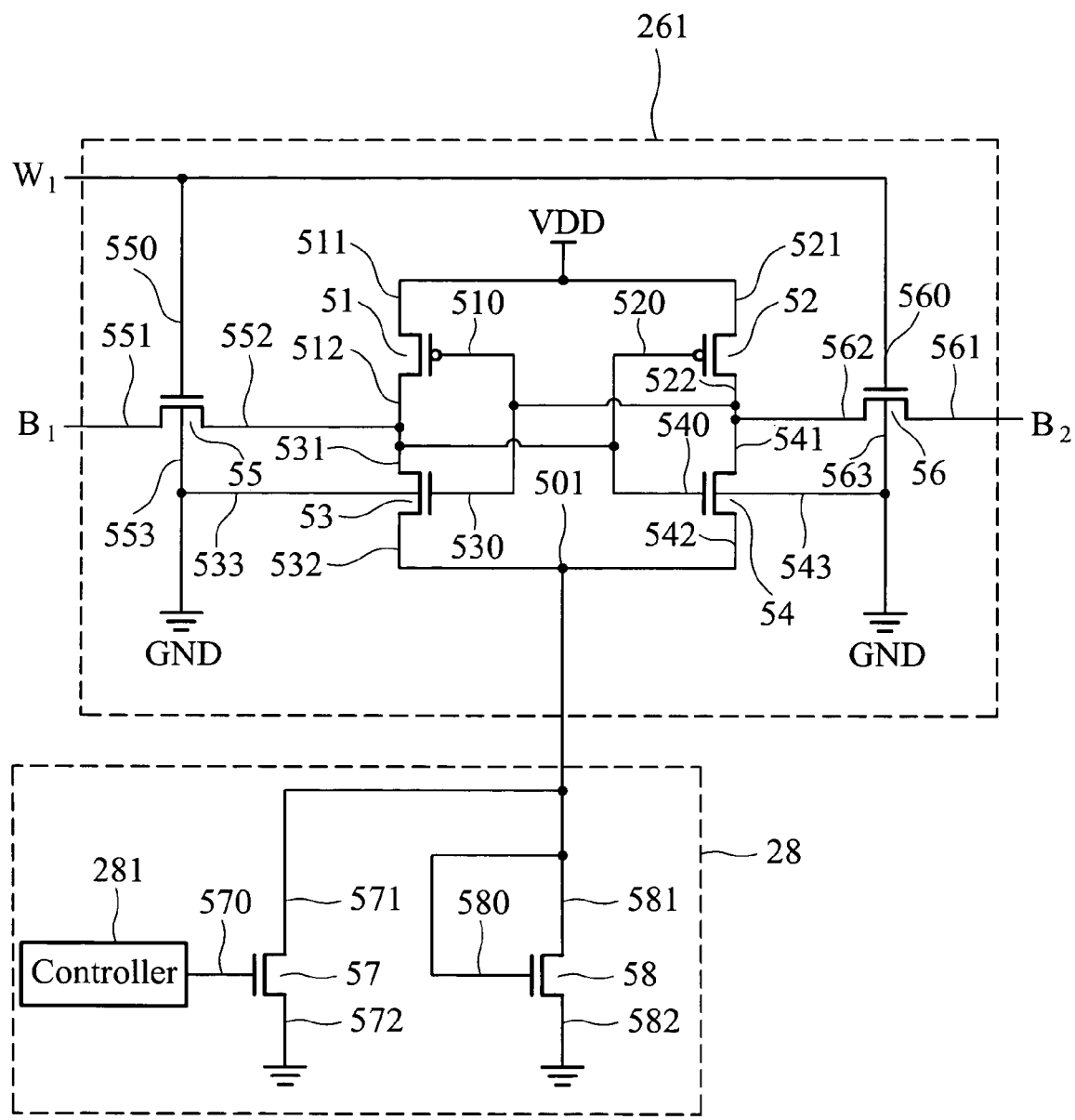
FIG. 5 is a schematic diagram of an exemplary embodiment of a memory cell.

FIG. 5 is a schematic diagram of an exemplary embodiment of a memory cell. Memory cell 261 comprises transistors 51~56. Transistors 51 and 52 are P-type transistors and transistors 53~56 are N-type transistors. A voltage VDD is received by an electrode 511 of transistor 51 and an electrode 521 of transistor 52.

Transistor 53 comprises a gate 530, electrodes 531 and 532, and a substrate 533. Gate 530 is coupled to a gate 510 of transistor 51 and an electrode 522 of the transistor 52. Electrode 531 is coupled to an electrode 512 of transistor 51. Electrode 532 is coupled to a point 501. Substrate 533 receives a voltage GND.

Transistor 54 comprises a gate 540, electrodes 541 and 542, and a substrate 543. Gate 540 is coupled to a gate 520 of transistor 52 and electrode 512 of the transistor 51. Electrode 541 is coupled to electrode 522 of transistor 52. Electrode 542 is coupled to point 501. Substrate 543 receives voltage GND.

Transistor 55 comprises a gate 550, electrodes 551 and 552, and a substrate 553. Gate 550 is coupled to a word line $W_1$. Electrode 551 is coupled to a bit line $B_1$. Electrode 552 is coupled to electrode 512 of transistor 51. Substrate 553 receives voltage GND.

Transistor 56 comprises a gate 560, electrodes 561 and 562, and a substrate 563. Gate 560 is coupled to word line $W_1$. Electrode 561 is coupled to a bit line $B_2$. Electrode 562 is coupled to electrode 522 of transistor 52. Substrate 553 receives voltage GND.

The voltage of point 501 is controlled by control unit 28. In a stand-by mode, the voltage of point 501 is equal to a first preset value. In a normal mode, the voltage of point 501 is equal to a second preset value. In this embodiment, the second preset value is equal to voltage GND and the first preset value exceeds voltage GND.

Control unit 28 comprises transistors 57 and 58 and a controller 281. Transistors 57 and 58 are N-type transistors. Transistor 57 comprises a gate 570 and electrodes 571 and 572. Gate 570 is coupled to controller 281. Electrode 571 is coupled to point 501. Electrode 572 receives voltage GND. Transistor 58 comprises a gate 580 and electrodes 581 and 582. Gate 580 and electrode 581 are coupled to point 501. Electrode 582 receives voltage GND.

In normal mode, controller 281 turns on transistor 57 such that the voltage of point 501 is equal to voltage GND. In stand-by mode, controller 281 turns off transistor 57 such that the voltage of point 501 exceeds voltage GND.

In this embodiment, voltage VDD exceeds voltage GND and voltage GND is equal to a ground voltage. Data received by bit line $B_1$ is opposite to that of bit line $B_2$. Additionally, control unit 28 of FIG. 5 corresponds to control unit 28 of FIG. 2 and memory cell 261 of FIG. 5 corresponds to one memory cell of memory array 26 of FIG. 2.

Figure 6:
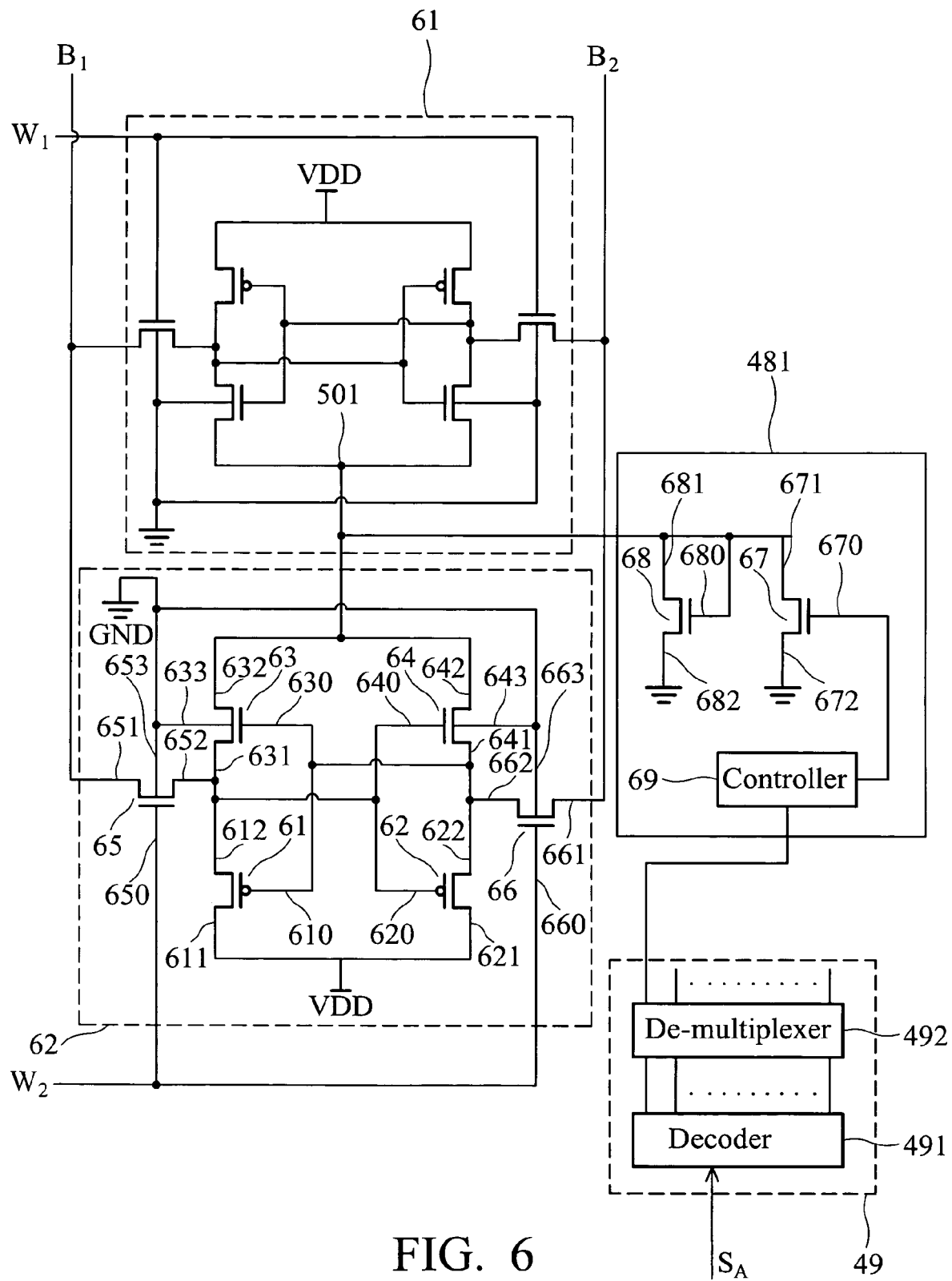
FIG. 6 is a schematic diagram of an exemplary embodiment of a memory cell, a control unit, and a processing module.

FIG. 6 is a schematic diagram of an exemplary embodiment of a memory cell, a control unit, and a processing module. A memory cell 61 of FIG. 6 corresponds to one memory cell of row memory cell $RM_1$ of FIG. 4a and a memory cell 62 of FIG. 6 corresponds to one memory cell of row memory cell $RM_2$ of FIG. 4a. Since the connection relationships of memory cell 61 and memory cell 261 follow the same principle, description of memory cell 61 is omitted.

Memory cell 62 comprises transistors 61~66. Transistors 61 and 62 are P-type transistors. Transistors 63~66 are N-type transistors. Voltage VDD is received by an electrode 611 of transistor 61 and an electrode 621 of transistor 62.

Transistor 63 comprises a gate 630, electrodes 631 and 632, and a substrate 633. Gate 630 is coupled to a gate 610 of transistor 61 and an electrode 622 of the transistor 62. Electrode 631 is coupled to an electrode 612 of transistor 61. Electrode 632 is coupled to point 501. Substrate 633 receives voltage GND.

Transistor 64 comprises a gate 640, electrodes 641 and 642, and a substrate 643. Gate 640 is coupled to a gate 620 of transistor 62 and electrode 612 of the transistor 61. Electrode 641 is coupled to an electrode 622 of transistor 62. Electrode 642 is coupled to point 501. Substrate 643 receives voltage GND.

Transistor 65 comprises a gate 650, electrodes 651 and 652, and a substrate 653. Gate 650 is coupled to a word line $W_2$. Electrode 651 is coupled to bit line $B_1$. Electrode 652 is coupled to electrode 612 of transistor 61. Substrate 653 receives voltage GND.

Transistor 66 comprises a gate 660, electrodes 661 and 662, and a substrate 663. Gate 660 is coupled to word line $W_2$. Electrode 661 is coupled to bit line $B_2$. Electrode 662 is coupled to electrode 622 of transistor 62. Substrate 663 receives voltage GND.

Control unit 481 controls the voltage of point 501 and comprises transistors 67 and 68 and controller 69. Transistor 67 comprises a gate 670 and electrodes 671 and 672. Gate 670 is coupled to controller 69. Electrode 671 is coupled to point 501. Electrode 672 receives voltage GND. Transistor 68 comprises a gate 680 and electrodes 681 and 682. Gate 680 and electrode 681 are coupled to point 501. Electrode 682 receives voltage GND.

In normal mode, controller 69 turns on transistor 67 such that the voltage of point 501 is equal to voltage GND. In stand-by mode, controller 69 turns off transistor 67 such that the voltage of point 501 exceeds voltage GND.

A processing module 49 activates controller 69 for control the voltage of point 501 according to the address signal $S_A$. In this embodiment, processing module 49 comprises a decoder 491 and a de-multiplexer 492. Decoder 491 decodes the address signal $S_A$ and outputs the decoded result. De-multiplexer activates control unit 481 according to the decoded result.

In stand-by mode, external device 45 does not output the address signal $S_A$. When processing module 49 does not receive the address signal $S_A$, controller 69 is deactivated. Thus, the voltage of point 501 exceeds voltage GND.

In normal mode, an external device 45 outputs the address signal $S_A$. When the decoded result corresponds to the address of memory cell 61 or 62, controller 69 is activated by de-multiplexer 492. Thus, the voltage of point 501 is equal to voltage GND.

In stand-by mode, the voltage of point 501 exceeds voltage GND and in normal mode, the voltage of point 501 is equal to voltage GND such that the leakage current of each memory cell is reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A static random access memory, comprising:
a row driver selecting a first word line or a second word line according to an address signal;
a column driver providing data to a first bit line and a second bit line, wherein the data received by the first bit line is opposite to that of the second bit line;
a first P-type transistor comprising a first electrode receiving a first voltage;
a second P-type transistor comprising a first electrode receiving the first voltage;
a first N-type transistor comprising a gate coupled to a gate of the first P-type transistor and a second electrode of the second P-type transistor, a first electrode coupled to a second electrode of the first P-type transistor, a second electrode coupled to a point, and a substrate receiving a second voltage;
a second N-type transistor comprising a gate coupled to a gate of the second P-type transistor and the second electrode of the first P-type transistor, a first electrode coupled to the second electrode of the second P-type transistor, a second electrode coupled to the point, and a substrate receiving the second voltage;
a third N-type transistor comprising a gate coupled to the first word line, a first electrode coupled to the first bit line, a second electrode coupled to the second electrode of the first P-type transistor, and a substrate receiving the second voltage;
a fourth N-type transistor comprising a gate coupled to the first word line, a first electrode coupled to the second bit line, a second electrode coupled to the second electrode of the second P-type transistor, and a substrate receiving the second voltage;
a third P-type transistor comprising a first electrode receiving the first voltage;
a fourth P-type transistor comprising a first electrode receiving the first voltage;
a fifth N-type transistor comprising a gate coupled to a gate of the third P-type transistor and a second electrode of the fourth P-type transistor, a first electrode coupled to a second electrode of the third P-type transistor, a second electrode coupled to the point, and a substrate receiving the second voltage;
a sixth N-type transistor comprising a gate coupled to a gate of the fourth P-type transistor and the second electrode of the third P-type transistor, a first electrode coupled to the second electrode of the fourth P-type transistor, a second electrode coupled to the point, and a substrate receiving the second voltage;
a seventh N-type transistor comprising a gate coupled to the second word line, a first electrode coupled to the first bit line, a second electrode coupled to the second electrode of the third P-type transistor, and a substrate receiving the second voltage;
a eighth N-type transistor comprising a gate coupled to the second word line, a first electrode coupled to the second bit line, a second electrode coupled to the second electrode of the fourth P-type transistor, and a substrate receiving the second voltage;
a control unit controlling a voltage of the point, wherein in a normal mode, the voltage of the point is equal to the second voltage, and in a stand-by mode, the voltage of the point exceeds the second voltage, wherein the control unit comprises:
a ninth N-type transistor comprising a first electrode coupled to the point and a second electrode receiving the second voltage;
a tenth N-type transistor comprising a gate coupled to the point, a first electrode coupled to the point, and a second electrode receiving the second voltage; and
a controller coupled to a gate of the ninth N-type transistor, wherein in normal mode, the ninth N-type transistor is turned on by the controller such that the voltage of the point is equal to the second voltage, in stand-by mode, the ninth N-type transistor is turned off by the controller such that the voltage of the point exceeds the second voltage; and
a processing module activating the controller according to the address signal.

2. The static random access memory as claimed in claim 1, wherein the first voltage exceeds the second voltage.

3. The static random access memory as claimed in claim 2, wherein the second voltage is equal to a ground voltage.

4. The static random access memory as claimed in claim 1, wherein the processing module comprises:

a decoder decoding the address signal and outputting the decoded result; and a de-multiplexer activating the controller for turning on the ninth N-type transistor when the decoded result corresponds to the address of the first or the second bit line.

5. The static random access memory as claimed in claim 1, wherein when the first or the second word line is selected, the ninth N-type transistor is turned on by the controller, and when the first or the second word line is not selected, the ninth N-type transistor is turned off by the controller.

6. The static random access memory as claimed in claim 5, wherein the first voltage exceeds the second voltage.

7. The static random access memory as claimed in claim 6, wherein the second voltage is equal to a ground voltage.

* * * * *